US007466250B2

(12) United States Patent
Buisson

(10) Patent No.: US 7,466,250 B2
(45) Date of Patent: Dec. 16, 2008

(54) TIME INTERLEAVED ANALOGUE/DIGITAL CONVERSION DEVICE WITH SELF ADAPTIVE EQUALISATION

(75) Inventor: Philippe Buisson, Deuil la Barre (FR)

(73) Assignee: Thales (FR)

( * ) Notice: Subject to any disclaimer, the term of this patent is extended or adjusted under 35 U.S.C. 154(b) by 0 days.

(21) Appl. No.: 11/620,344

(22) Filed: Jan. 5, 2007

(65) Prior Publication Data

US 2007/0205934 A1 Sep. 6, 2007

(30) Foreign Application Priority Data

Jan. 6, 2006 (FR) .................................. 06 00121

(51) Int. Cl.
*H03M 1/10* (2006.01)

(52) U.S. Cl. ...................................... 341/120; 341/155

(58) Field of Classification Search ................ 341/120, 341/155

See application file for complete search history.

(56) References Cited

U.S. PATENT DOCUMENTS

| | | | | |
|---|---|---|---|---|
| 5,239,299 | A | 8/1993 | Apple et al. | |
| 7,245,638 | B2 * | 7/2007 | Agazzi et al. | 370/516 |
| 2007/0069937 | A1 * | 3/2007 | Balakrishnan et al. | 341/161 |
| 2007/0146181 | A1 * | 6/2007 | Chen et al. | 341/120 |
| 2007/0171116 | A1 * | 7/2007 | Fuse et al. | 341/161 |

FOREIGN PATENT DOCUMENTS

| | | |
|---|---|---|
| EP | 1 401 105 A | 3/2004 |
| JP | 2004328436 A * | 11/2004 |

OTHER PUBLICATIONS

Machine translation of JP 2004328436 A dated Nov. 2004.*

Abstract of JP 2004 328436 Nov. 18, 2004 Anritsy Corp.

Dyer K et al: "Analog background calibration of a 10 b 40 Msample/s paralle pipelined ADS" Solid-State Circuits conference, 1998 Digest of Technical Papers 1998 International San Francisco, CA Feb. 5, 1998.

Hummels D M et al: Distortion compensation for time interleaved analog to digital converters >> Jun. 4, 1996, Instrumentation and Measurement technology Conference 1996. Jun. 6, 1996 New York.

* cited by examiner

*Primary Examiner*—Howard Williams
(74) *Attorney, Agent, or Firm*—Lowe Hauptman Ham & Berner, LLP

(57) ABSTRACT

The invention relates to an equalised time interleaved analogue digital conversion device. The analogue digital conversion device comprises a number N of analogue digital converters distributed in N channels. Each analogue digital converter has a sampling frequency N times lower than the required sampling frequency. The digital signal is built up from samples output from each channel. The device comprises a reference channel comprising an analogue digital converter generating samples of the analogue signal. Each filter comprises an equaliser filter. The filter received a digital signal output by the analogue digital converter of the channel on which it is placed. The filter also receives an error signal and outputs a filtered digital signal s(n) corrected for errors deduced from the error signal. The error signal corresponds to the difference at a given time between firstly the digital signal corrected by the filter and secondly by the digital signal output by the analogue digital converter of the reference channel. In particular, the invention is applicable to analogue digital converters operating at a high clock frequency, typically of the order of one gigahertz.

14 Claims, 2 Drawing Sheets

TIME INTERLEAVED ANALOGUE/DIGITAL CONVERSION DEVICE WITH SELF ADAPTIVE EQUALISATION

RELATED APPLICATION

The present application is based on, and claims priority from, France Application Number 06 00121, filed on Jan. 6, 2006, the disclosure of which is hereby incorporated by reference herein in its entirety.

FIELD OF THE INVENTION

This invention relates to an equalized time interleaved analogue digital conversion device. In particular, the invention is applicable to analogue digital converters operating at a high clock frequency, typically of the order of one Gigahertz.

BACKGROUND OF THE INVENTION

One of the characteristics of an analogue digital converter is its sampling frequency, in other words the number of digital samples of an analogue signal that it is capable of producing per unit time. In particular, each analogue digital converter comprises a clock outputting a signal controlling the frequency at which digital samples are produced. Therefore the maximum sampling frequency forms an intrinsic limit to an analogue digital converter. When it is required to sample at a high frequency, typically of the order of one Gigahertz, an analogue digital converter with a corresponding sampling frequency can be chosen provided that a component with such a characteristic is available. The cost of such a component depends particularly on its maximum sampling frequency and increases with this frequency.

Another solution that groups time interleaved analogue digital converters in common, is to make a number N of analogue digital converters operate in parallel, each then using a clock with a frequency N times lower than the required sampling frequency $F_e$. The clock of each analogue digital converter is offset in time compared with the clock of the analogue digital converter preceding it by a required sample clock period $F_e$. The result is the equivalent of a converter operating at the required sampling frequency $F_e$ with N analogue digital converters in parallel each operating at a sampling frequency $$\frac{F_e}{N}.$$

This solution requires a large similarity of characteristics of analogue digital converters. The characteristics that must be very similar include particularly the offset voltage and gain of the digital output signal from each analogue digital converter. Furthermore, the clocks of the analogue digital converters must be precisely synchronized to sample at the required time. The passband of the analogue signal that an analogue digital converter is capable of receiving at the input must also be the same for all the analogue digital converters.

Therefore, it is particularly complex and difficult to combine all these conditions. Disparities between analogue digital converters lead to the occurrence of errors in the digital output signal. Therefore the digital output signal from time interleaved analogue digital converters is significantly degraded.

However, it is still possible to partially correct this type of error by known digital filtering techniques. However, these filtering techniques require an initialization phase, in which errors are made on the digital output signal from analogue digital converters. Once the error has been partly characterized after the initialization phase, digital filtering means are used to correct the digital output signal. But these digital filtering means are not well adapted to frequency variations and variations in the input signal level during time, particularly if these variations are fast, which is the case for signals with a wide range.

SUMMARY OF THE INVENTION

In particular, the purpose of the invention is to overcome the disadvantages mentioned above. To achieve this, the purpose of the invention is an analogue digital conversion device receiving an analogue signal at its input and outputting a digital signal at a required sampling frequency. The device comprises a number N of analogue digital converters distributed in N channels. Each analogue digital converter has a sampling frequency N times lower than the required sampling frequency. The analogue digital converters have clock signals controlling their sampling frequency, offset in time from each other by one period of a signal at the required sampling frequency. The digital signal is built up from samples delivered to the output from each channel. The device comprises a reference channel comprising an analogue digital converter generating samples of the analogue signal. Each channel comprises an equalizer filter. The filter receives a digital signal at its input, this signal being output by the analogue digital converter on the channel on which it is located. The filter also receives an error signal and outputs a filtered digital signal s(n) corrected for errors deduced from the error signal. The error signal corresponds to the difference at a given time between firstly the digital signal corrected by the filter and secondly by the digital signal output by the analogue digital converter of the reference channel. The coefficients of said filter are adjusted to have the response that best minimizes the error signal.

In one embodiment, the error signal corresponds to the difference at a given time between firstly the digital signal corrected both by the filter and by an offset correction device, and secondly by the digital signal output by the analogue digital converter of the reference channel. The offset correction device outputs an offset error signal $Y_n$. The offset error signal $Y_n$ is generated at time n applying the following mathematical relation $y_{n+1}=y_n+err_n*\mu$ at time n where $err_n$ is the value of the error signal at time n and $\mu$ is a parameter setting value.

In another embodiment, once the analogue digital converter of the reference channel has generated a sample at the same time as the channel placed in the $i^{th}$ position, where i is between 1 and N, the analogue digital converter of the reference channel will generate the next sample at the same time as the channel arranged in the $(i+1 \text{ modulo } N)^{th}$ position.

Furthermore, the filter of each channel may be a filter with a finite self-adaptive pulse response comprising 2.q+1 coefficients, where q is an integer. The coefficients of the filters of each channel may be adapted by a Least Mean Squares Algorithm.

Advantageously, for i integer varying from 2 to q, the coefficients $C_i$, are defined by a fixed relation between them. For example, the central coefficient $C_0$ and the first coefficient $C_1$ of the filter are updated by a self-adaptive method, the coefficient $C_{-1}$ being equal to $-C_1$, the coefficients $C_{-i}$ for I varying from 2 to q being equal to $-C_i$, the coefficients $C_i$ for i varying from 2 to q being determined from $C_1$ by the following relation $$C_i = \frac{k(i)\cdot C_1}{((-1)^{i+1}\cdot i)}$$

with a factor k(i) dependent on i. The factor k(i) may be chosen to be decreasing and varying approximately from 1 for i close to 2 towards 0 for i tending towards q.

In one particular embodiment, the central coefficient $C_0$ and the first coefficient $C_1$ of the filter are updated by a self-adaptative method, the coefficient $C_{-1}$ being equal to $-C_1$, the coefficients $C_{-i}$, for i varying from 2 to q, being equal to $-C_i$, the coefficients $C_i$, for I varying from 2 to q being determined from $C_1$ using the following relation $$C_i = \frac{C_1}{-i}$$

for even values of i and $$C_i = \frac{C_1}{i}$$

for odd values of i.

The filter of each channel can operate at the required sampling frequency, by oversampling in a ratio N at the input to said filter (20). The samples available at a given time on one of the other channels can then be used at the input to said filter, the samples being input to the filter at the required sampling frequency.

In particular, the advantages of the invention are that it is capable of correcting the digital signal without any prior calibration or setting, which makes it insensitive particularly to temperature variations. Furthermore, the invention has excellent reproducibility and facilitates implementation.

BRIEF DESCRIPTION OF THE DRAWINGS

Other characteristics and advantages of the invention will become clear after reading the following description with reference to the appended drawings that represent.

DETAILED DESCRIPTION

Figure 1A:
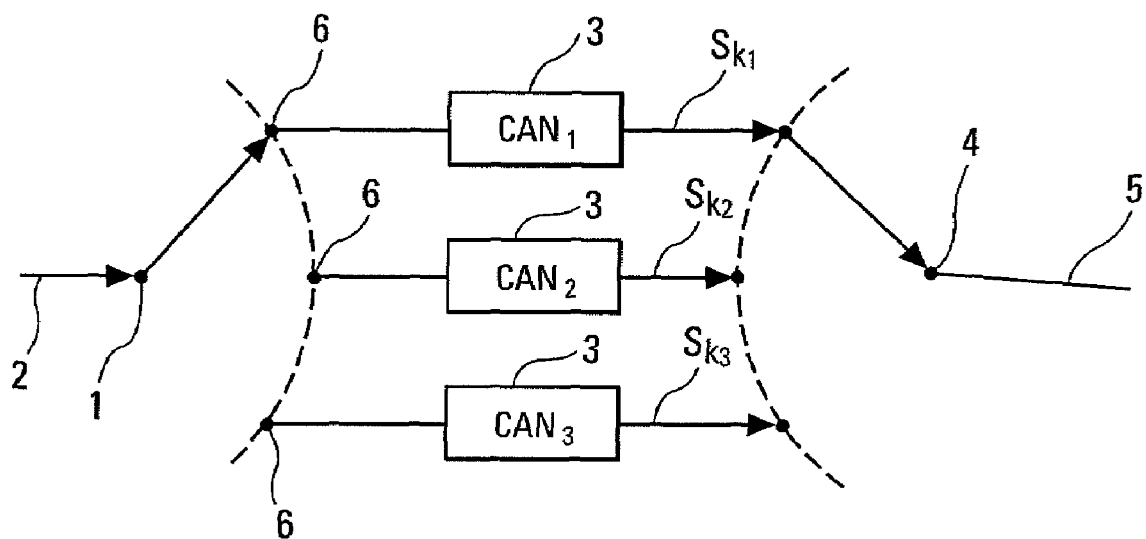
FIG. 1*a*, an analogue digital conversion device comprising several analogue digital converters in parallel according to the state of the art.

FIG. 1*a* illustrates an analogue digital conversion device comprising several analogue digital converters according to the state of the art, in parallel.

As illustrated in FIG. 1*a*, the analogue digital conversion device receives an analogue signal 2 on an input 1 and produces a digital signal 5 on the output 4. The digital signal 5 comprises digital samples of the analogue signal 2. The occurrence frequency of digital samples is equal to a given frequency, called the required sampling frequency $F_e$. The analogue digital conversion device also comprises a number N of analogue digital converters 3 distributed in N channels 6. There are three analogue digital converters 3 in the example in FIG. 1*a*; a first $CAN_1$ on a channel 6 outputting a digital signal $S_{K1}$, a second $CAN_2$ on a channel 6 outputting a digital signal $S_{K2}$, and the third $CAN_3$ on a channel 6 outputting a digital signal $S_{K3}$. Each analogue digital converter 3 comprises particularly a clock outputting a signal controlling the frequency at which the digital samples are produced and the moment at which the digital samples are sampled on the analogue signal 2. The clock frequency of each analogue digital converter 3 is chosen to be N times lower than the required sampling frequency $F_e$.

Figure 1B:
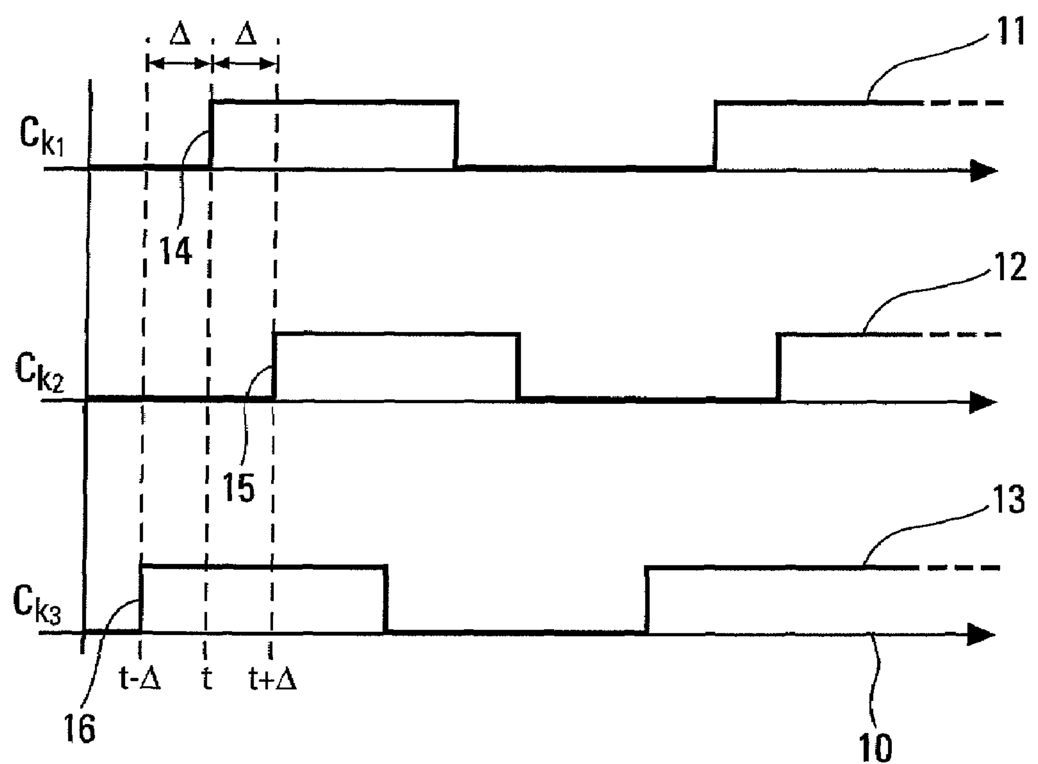
FIG. 1*b*, the clock signal for the various analogue digital converters of the analogue digital conversion device according to the state of the art.

FIG. 1*b* illustrates the clock signal of the different analogue digital converters of the analogue digital conversion device according to the state of the art, in a chronogram. Time is represented by an abscissa axis 10. A curve 11 represents the clock signal of the analogue digital converter 3 $CAN_1$. The clock signal represented by curve 11 in particular comprises a rising front 14 at time t. A curve 12 represents the clock signal of the analogue digital converter 3 $CAN_2$. In particular, the clock signal represented by the curve 12 comprises a rising front 15 at time t+Δ. A curve 13 represents the clock signal of the analogue digital converter 3 $CAN_3$. The clock signal represented by the curve 13 comprises particularly a rising front 15 at time t−Δ. The clock signal of each analogue digital converter 3 is offset from the clock signal of the previous analogue digital converter by a clock period Δ operating at the required sampling frequency $F_e$. The analogue digital conversion device according to the state of the art presented is usually denoted as a time interleaved analogue digital converter.

FIG. 1*a* shows the digital signal 5 constructed alternately from signals $S_{K1}$, $S_{K2}$, $S_{K3}$ output by the analogue digital converters $CAN_1$, $CAN_2$ and $CAN_3$. The result is the equivalent of an analogue digital converter operating at the required sampling frequency $F_e$ with N analogue digital converters 3 put in parallel, each operating at a sampling frequency $F_e/N$.

The analogue digital conversion device generates a digital signal 5 at output 4, particularly affected by errors due to disparities between the analogue digital converters 3. In particular, these errors include:

- offset errors of the digital signal output by the different analogue digital converters 3, causing the appearance of lines in the digital signal spectrum 5, at frequencies $$k\frac{F_e}{N},$$

where k varies from 0 to N−1, the amplitude of which is related to the inter-channel offset errors 6;
- gain errors corresponding to gain differences between channels 6 causing the appearance of lines in the digital signal spectrum 5 at frequencies $$k\frac{F_e}{N} \pm F_{in},$$

where k varies from 0 to N−1 and $F_{in}$ being the frequency of the analogue signal 2, the amplitude of these lines being related to gain errors between channels 6;

phase errors corresponding to clock time shift errors causing the appearance of lines in the digital signal spectrum 5 at frequencies $$k\frac{F_e}{N} \pm F_{in},$$

where k varies from 0 to N−1 and $F_{in}$ being the frequency of the analogue signal 2, the amplitude of these lines being related to clock phase errors and proportional to the frequency of the analogue signal 2;

passband errors corresponding to differences in the analogue passband causing the appearance of lines in the digital signal spectrum 5, at frequencies $$k\frac{F_e}{N} \pm F_{in}$$

where k varies from 0 to N−1 and $F_{in}$ being the frequency of the analogue signal 2, these errors combining non-linearly with gain and phase errors.

Figure 2:
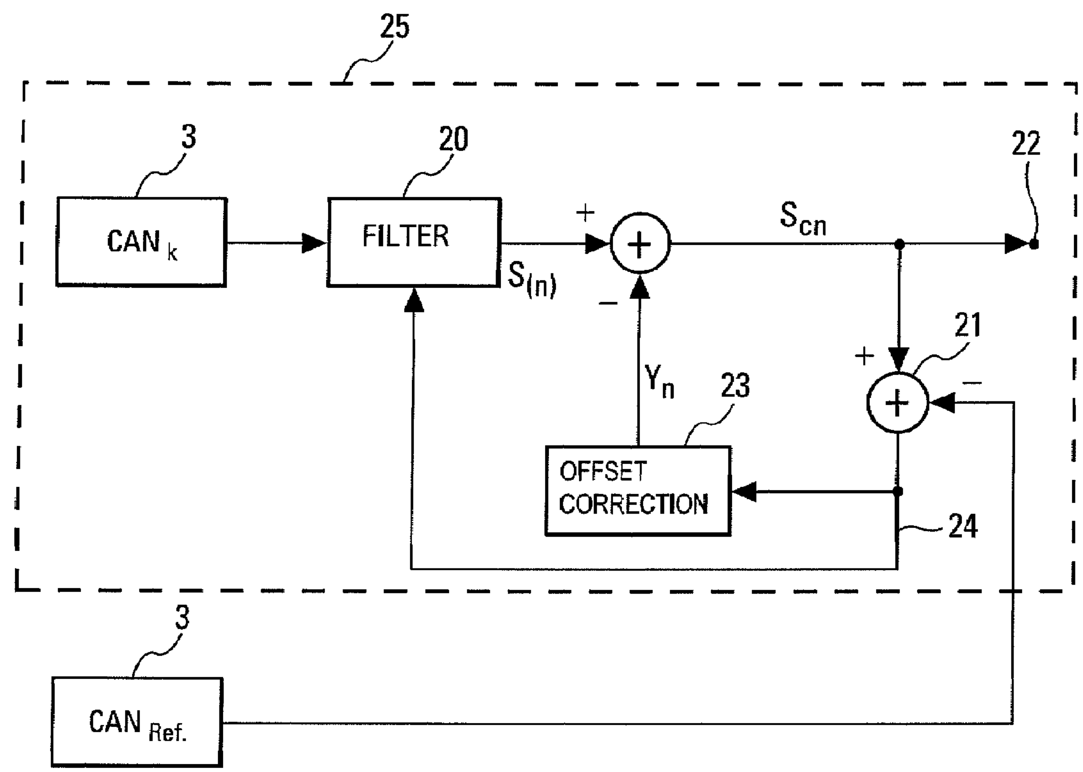
FIG. 2, the structure of an analogue digital conversion device according to the invention.

FIG. 2 shows a block diagram showing the structure of an analogue digital conversion device according to the invention. Elements identical to elements shown in other figures are marked with the same references. The analogue digital conversion device according to the invention is a time interleaved analogue digital converter comprising N analogue digital converters 3 in parallel, each operating at a sampling frequency $$\frac{F_e}{N}.$$

In particular, FIG. 2 shows the detail of a given channel 25 of the device according to the invention among the N channels 25 of the analogue digital conversion device according to the invention. The channels 25 replace the channels 6 of a time interleaved analogue digital converter according to the state of the art, in the digital analogue conversion device according to the invention. In FIG. 2, the channel 25 represented is the $k^{th}$ channel. Obviously, the other channels have an identical structure. Also, channel k comprises an analogue digital converter 3 denoted $CAN_k$. A reference channel N+1 is added. This reference channel N+1 comprises particularly an analogue digital converter 3 denoted $CAN_{ref}$. The reference channel generates samples of the analogue signal 2.

The given channel k comprises a filter 20 performing the error reduction function on the signal output by the analogue digital converter $CAN_k$. The filter 20 is an equalizer filter. Therefore, the filter 20 receives firstly the digital signal output by the analogue digital converter $CAN_k$ and secondly an error signal 24 denoted $err_n$ for a given time n. The filter 20 outputs a filtered digital signal s(n) corrected for errors deduced from the error signal 24. The error signal 24 corresponds to the difference at a given time between firstly the digital signal corrected by the filter 20 and by an offset correction device 23, and secondly by the digital signal output by the analogue digital converter $CAN_{ref}$ for the reference channel N+1. The filter 20 is self-adaptive: the coefficients of said filter 20 are automatically adjusted to present the response that best minimizes the error signal 24. This makes it possible to adapt to variations in the characteristics of analogue digital converters 3 that can for example occur in time or when temperature variations occur. For example, the filter 30 may be a filter with a finite pulse response. The offset correction device 23 can correct the offset error of the filtered digital signal s(n). The offset correction device 23 outputs an offset error signal $Y_n$. The offset error signal $Y_n$ may for example be generated at a time n by applying the following mathematical relation: $y_{n+1}=y_n+err_n*\mu$ at time n where μ is a parameter setting value, the corrected digital signal $S_{cn}$ is calculated by applying the following mathematical relation $s_{cn}=s(n)-y_n$. The convergence rate and the amplitude of the residual error depend on the value of μ.

If the filter 20 is a finite pulse response filter, a Least Mean Squares Algorithm can be used to adapt the coefficients of said filter 20. When the filter 20 comprises 2.q+1 (where q is an integer) coefficients denoted $C_{-q}, C_{-q+1}, \ldots C_0, C_1 \ldots C_q$, the output of the filter 20 at time k is given by the relation $$Y_k = \sum_{j=-q}^{+q} C_j x_{k-j},$$

where $x_k$ is the input to the filter 20 at time k. The Least Mean Squares Algorithm can be written using the following mathematical relation $C_j(k+1)=C_j(k)-\alpha.x_{k-j}.err_k$, where $x_{k-j}$ is the input sample present at the $j^{th}$ coefficient at time k, α represents the step of the algorithm (the convergence rate and the amplitude of residual error will depend on this value). If no correction is to be made, the coefficients will be zero, except for the central coefficient $C_0$ that will be equal to 1. Filtering will be done at a frequency $$\frac{F_e}{N}$$

while the coefficients are adapted at $$\frac{F_e}{N(N+1)}.$$

This algorithm can be simplified by replacing $x_{k-j}$ by its sign, or the error by its sign, or both by their signs. The result is then one of the following three algorithms represented by the following relations:

$$C_j(k+1)=C_j(k)-\alpha.\mathrm{sgn}(x_{k-j}).err_k$$

$$C_j(k+1)=C_j(k)-\alpha.x_{k-j}.\mathrm{sgn}(err_k)$$

$$C_j(k+1)=C_j(k)-\alpha.\mathrm{sgn}(x_{k-j}).\mathrm{sgn}(err_k).$$

This can simplify the calculations particularly in the final case in which the coefficients are effectively adapted by adding α to the previous coefficient or subtracting α from it or doing nothing, depending on the corresponding signs of $x_{k-j}$ and $err_k$.

A analogue digital conversion device according to the invention comprises as many channels 25 as necessary. Thus, an analogue digital conversion device according to the invention may for example have 4 analogue digital converters 3 in parallel distributed on 4 channels 25, each of working at a sampling frequency $$\frac{F_e}{4}.$$

This analogue digital conversion device according to the invention will also comprise a reference channel 4+1. Each channel 25 will also have a filter 20, each filter 20 performing the equalization function using the reference channel 4+1.

Figure 3:
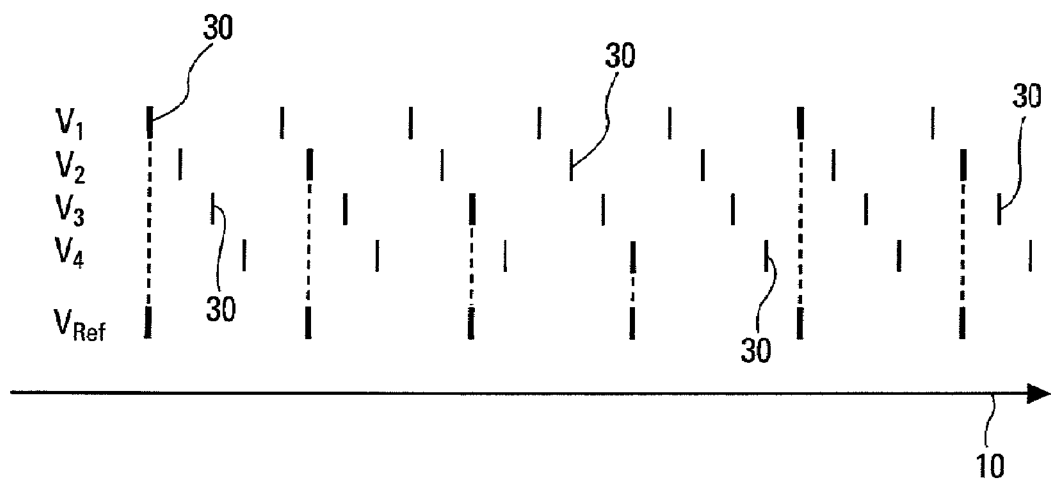
FIG. 3, sampling times of digital analogue converters of the different channels of the digital analogue conversion device according to the invention.

FIG. 3 illustrates the sampling times of analogue digital converters of the different channels of an analogue digital conversion device according to the invention, in a chronogram. Elements identical to elements previously presented in other figures have the same references. The analogue digital conversion device according to the invention comprises N analogue digital converters 3 in parallel distributed on N channels 25, each working at a sampling frequency $$\frac{F_e}{N},$$

and the reference channel N+1. Sampling times of the N first channels respect the constraints of a time interleaved system.

The chronogram comprises an abscissa axis 10 representing time. Vertical bars 30 symbolize the times at which the digital samples are built up for each channel 6. FIG. 3 illustrates the example of an analogue digital conversion device according to the invention with 4 analogue digital converters 3 in parallel distributed on 4 channels 25 denoted $V_1$, $V_2$, $V_3$ and $V_4$ and a reference channel N+1 denoted $V_{ref}$.

The samples of the reference channel $V_{ref}$ of the analogue signal 2 are produced at the same times as the samples of one of the channels $V_1$, $V_2$, $V_3$, $V_4$. Furthermore, if sampling on the reference channel $V_{ref}$ is done at a given time at the same time as the sampling on the channel $V_1$, the next sampling will take place at the same time as sampling on channel $V_2$. A period equal to approximately one clock period at $$\frac{F_e}{5}$$

will elapse between the two samples. The next sampling will then take place at the same time as sampling of channel 6 $V_3$. A period equal to approximately one clock period at $$\frac{F_e}{5}$$

will elapse between the two samples. The next sampling will then take place at the same time as the sampling on channel $V_4$. A period equal to approximately one clock period at $$\frac{F_e}{5}$$

will elapse between the two samples. Finally, the next sampling will then take place at the same time as the sampling on channel $V_1$. A period equal to approximately one clock period at $$\frac{F_e}{5}$$

will elapse between the two samples. The cycle then starts again.

More generally, once the analogue digital converter 3 of the reference channel has generated a sample at the same time as the channel 25 arranged in the $i^{rh}$ position, where i is between 1 and N, the analogue digital converter 3 of the reference channel will generate a sample at the same time as on channel 25 arranged in the (i+1 modulo N)$^{th}$ position. The frequency of the sampling clock on the reference channel is equal to approximately $$\frac{F_e}{N+1}.$$

For a given channel 25, there will be one sample every N×(N+1) samples, namely with intervals equal to $$\frac{N\times(N+1)}{F_e}.$$

In one particularly advantageous embodiment, the filter 20 is a finite pulse response filter.

When the filter 20 comprises 2.q+1 (where q is an integer) coefficients denoted $C_{-q}$, $C_{-q+1}$, . . . $C_0$, $C_1$ . . . $C_q$, the output of the filter 20 at time k is given by the following relation $$Y_k=\sum_{j=-q}^{+q}C_j x_{k-j},$$

where $x_k$ is the input to the filter 20 at time k. The gain of the filter is determined by the coefficient $C_0$. Assuming that this gain is equal to 1, the filter 20 has a frequency response defined by the relation $H(f)=e^{-j2\pi\delta t}$, namely a gain of 1 and a phase shift equal to $-2\pi f\delta t$. The pulse response at time t=i/Fe of the filter 20 may be estimated, assuming that $Fe\delta t$ is very much less than 1, using the following mathematical relation $$s(i)\approx(-1)^{i+1}\frac{F_e\delta t}{i}$$

where i is not equal to 0 and where δt is the error on the sampling clock at $$\frac{F_e}{N}$$

(in other words sampling at the analogue digital converter 3 of channel 6 is done with a delay of δt seconds). Furthermore, the filter 20 is antisymmetric (s(i)=−s(−i)). Therefore, the value of the pulse response s(i) of the filter 20 at time i may be defined by the following two relations:

$$s(1) = Fe.\delta t \text{ and } \frac{s(1)}{s(i)} = (-1)^{i+1} i.$$

The term s(1) of the pulse response at time i is obtained by dividing the term s(1) by i if i is odd and by −i if i is even. Finite pulse response filters have the special feature that they are composed of coefficients directly corresponding to the terms in the pulse responses at times $$t = \frac{F_e}{N}.$$

Thus, the central coefficient $C_0$ corresponds to the pulse response at time t=0 and the coefficient $C_1$ corresponds to the response at time $$t = \frac{1}{F_e}$$

and more generally $C_i$=s(i). Therefore, the other coefficients may thus be deduced directly from the coefficient $C_1$. Since the filter 20 is an auto-adaptive filter, the central coefficient $C_0$ and the first coefficient $C_1$ are automatically updated by a self-adaptive method, for example using the Least Mean Squares Algorithm presented above. The coefficient $C_{-1}$ is equal to $-C_1$. Coefficients $C_{-i}$, for i varying from 2 to q, are equal to $-C_i$. The coefficients $C_i$, for i varying from 2 to q, are determined from $C_1$ by the following relation $$C_i = \frac{C_1}{-i}$$

for even values of i and $$C_i = \frac{C_1}{i}$$

for odd values of i. This procedure forces the equalizer to converge towards a given pulse response depending only on the error in the input signal and independent of its other characteristics such as its frequency.

Furthermore, the invention is not limited to the relations between the coefficients $C_i$ presented above. The coefficients $C_i$ are defined by a fixed relation between them. In one particular embodiment, each coefficient $C_i$ is weighted by a factor k(i) practically equal to 1 for the central coefficients and decreasing towards zero when going towards the extreme coefficients, in other words for coefficients $C_i$ where i tends towards q, to avoid ripples in the response caused by truncating the response. Therefore, the factor k(i) decreases and varies approximately from 1 if i is close to 2, towards zero for i tending towards q. The relation between the coefficients $C_i$ becomes then $$C_i = \frac{k(i) \cdot C_1}{((-1)^{i+1} \cdot i)},$$

where k(i) is dependent on i.

Each analogue digital converter 3 operates at a sampling frequency $$\frac{F_e}{N},$$

and consequently each of the filters 20 in particular also perform the equalizer function. Therefore, there is a folding in the spectrum of the corrected digital signal $S_{cn}$ around the frequency $$\frac{F_e}{N},$$

the Nyquist band being equal to $$\frac{F_e}{2N}.$$

Equalization is only done correctly within this $$\frac{F_e}{2N}$$

band which can be narrow if N is large. In one embodiment of the analogue digital converter according to the invention, this is overcome by having the filters 20 perform the equalization function operating at the required sampling frequency $F_e$ instead of $$\frac{F_e}{N}.$$

The equalization then operates correctly within a frequency band with width $$\frac{F_e}{2}.$$

To do this, it is necessary to oversample within a ratio N at the input to the filter 20. This is done by creating N−1 missing samples between two samples by interpolation. In a more advantageous embodiment, the samples available at a given time on one of the other channels 25 are used rather than attempting to interpolate the missing samples. The data then are input to the filter 20 at the required sampling frequency $F_e$. However, only one sample out of N is used at the output from the filter 20.

As an example, one possible embodiment of the analogue digital conversion device according to the invention comprises 4 analogue digital converters 3 operating at a sampling frequency of 250 MHz. Therefore, the analogue digital converter according to the invention has a sampling frequency of 1 GHz. The filters 20 performing the equalization function of each channel 25 may for example be used in one or several programmable or non-programmable logical circuits.

The invention claimed is:

1. Analog digital conversion device receiving an analog signal at its input and outputting a digital signal at a required sampling frequency, said device comprising:

a number N of analog digital converters distributed in N channels, each a-analog digital converter having a sampling frequency N times lower than the required sampling frequency, said analog digital converters having clock signals controlling their sampling frequency, offset in time from each other by one period of a signal at the required sampling frequency, the digital signal being built up from samples delivered to the output from each channel, said analog digital conversion device comprising a reference channel, said reference channel comprising an analog digital converter generating samples of the analog signal, each channel comprising an equalizer filter, said filter receiving a digital signal at its input output by the analog digital converter on the channel on which it is located and an error signal, said filter outputting a filtered digital signal s(n) corrected for errors deduced from the error signal, the error signal corresponding to the difference at a given time between firstly the digital signal corrected by the filter and secondly by the digital signal output by the analog digital converter of the reference channel, the coefficients of said filter being adjusted to present the response that best minimizes the error signal.

2. The device according to claim 1, wherein the error signal corresponds to the difference at a given time between firstly the digital signal corrected by both the filter and by an offset correction device and secondly by the digital signal output by the analogue digital converter of the reference channel, said offset correction device outputting an offset error signal $Y_n$., said offset error signal $Y_n$ being generated at time n by applying the mathematical relation $y_{n+1}=y_n+err_n*m$ at time n where $err_n$ is the value of the error signal (24) at time n and m is a value of the parameter setting.

3. The device according to claim 1, wherein once the analogue digital converter of the reference channel has generated a sample at the same time as the channel placed in the $i^{th}$ position, where i is between 1 and N, the analogue digital converter of the reference channel will generate the next sample at the same time as the channel arranged in the $(i+1 \text{ modulo } N)^{th}$ position.

4. The device according to claim 1, wherein the filter of each channel is a self-adaptive finite pulse response filter, said filter comprising $2 \cdot q+1$ coefficients, q being an integer.

5. The device according to claim 4 wherein said coefficients of the filters of each channel are adapted using a Least Mean Squares Algorithm.

6. The device according to claim 4, wherein if i is an integer varying from 2 to q, the coefficients $C_i$ are defined by a fixed relation to each other.

7. The device according to claim 4, wherein the central coefficient $C_0$ and the first coefficient $C_1$ of filter are updated by a self-adaptive method, the coefficient $C_{-1}$, being equal to $-C_1$, the coefficients $C_{-i}$, for i varying from 2 to q being equal to $-C_i$, the coefficients $C_i$, for i varying from 2 to q being determined from $C_1$ by the relation $$C_i = \frac{k(i) \cdot C_1}{((-1)^{i+1} \cdot i)}$$

with a factor k(i) dependent on i.

8. The device according to claims 4, wherein the factor k(i) is decreasing and varies from approximately 1 for i close to 2 towards zero for i tending towards q.

9. The device according to claim 4, wherein the central coefficient $C_0$ and the first coefficient $C_1$ of filter are updated by a self-adaptive method, the coefficient $C_{-1}$ being equal to $-C_1$, the coefficients $C_{-i}$ for i varying from 2 to q being equal to $-C_i$, the coefficients $C_i$ for i varying from 2 to q being determined from $C_1$ by the relation $$C_i = \frac{C_1}{i}$$

for even values of i and $$C_i = \frac{C_1}{-i}$$

and for odd values of i.

10. The device according to claim 4, wherein the filter of each channel operates at the required sampling frequency, by oversampling in a ratio N at the input to said filter.

11. The device according to claim 10, wherein the samples available at a given time on one of the other channels are used at the input to said filter, the samples input to the filter being input at the required sampling frequency.

12. Analog digital conversion device receiving an analog signal at its input and outputting a digital signal at a required sampling frequency ($F_e$), said device comprising a number N of analog digital converters distributed in N channels, each analog digital converter having a sampling frequency N times lower than the required sampling frequency ($F_e$), said analog digital converters having clock signals controlling their sampling frequency, offset in time from each other by one period ($\Delta$) of a signal at the required sampling frequency ($F_e$), the digital signal being built up from samples delivered to the output from each channel, said analog digital conversion device comprising a reference channel, said reference channel comprising an analog digital converter generating samples of the analog signal, each channel comprising an equalizer filter, said filter receiving a digital signal at its input output by the analog digital converter on the channel on which it is located and an error signal, said filter outputting a filtered digital signal s(n) corrected for errors deduced from the error signal, the error signal corresponding to the difference at a given time between firstly the digital signal corrected by the filter and secondly by the digital signal output by the analog digital converter of the reference channel, the coefficients of said filter being adjusted to present the response that best minimizes the error signal, wherein the filter of each channel is a self-adaptive finite pulse response filter, said filter comprising $2 \cdot q+1$ coefficients, q being an integer, and the central coefficient $C_0$ and the first coefficient $C_1$ of filter are updated by a self-adaptive method, the coefficient $C_{-1}$ being equal to $-C_1$, the coefficients $C_{-i}$ for i varying from 2 to q being equal to $-C_i$, the coefficients $C_i$, for i varying from 2 to q being determined from $C_1$ by the relation $$C_i = \frac{k(i) \cdot C_1}{((-1)^{i+1} \cdot i)}$$

with a factor k(i) dependent on i.

13. Analog digital conversion device receiving an analog signal at its input and outputting a digital signal at a required sampling frequency ($F_e$), said device comprising a number N of analog digital converters distributed in N channels, each analog digital converter having a sampling frequency N times lower than the required sampling frequency ($F_e$), said analog digital converters having clock signals controlling their sampling frequency, offset in time from each other by one period (Δ) of a signal at the required sampling frequency ($F_e$), the digital signal being built up from samples delivered to the output from each channel, said Analog digital conversion device comprising a reference channel, said reference channel comprising an analog digital converter generating samples of the analog signal, each channel comprising an equalizer filter, said filter receiving a digital signal at its input output by the analog digital converter on the channel on which it is located and an error signal, said filter outputting a filtered digital signal s(n) corrected for errors deduced from the error signal, the error signal corresponding to the difference at a given time between firstly the digital signal corrected by the filter and secondly by the digital signal output by the analog digital converter of the reference channel, the coefficients of said filter being adjusted to present the response that best minimizes the error signal, wherein the filter of each channel is a self-adaptive finite pulse response filter, said filter comprising 2·q+1 coefficients, q being an integer, and the filter of each channel operates at the required sampling frequency ($F_e$), by oversampling in a ratio N at the input to said filter.

14. Analog digital conversion device receiving an analog signal at its input and outputting a digital signal at a required sampling frequency ($F_e$), said device comprising a number N of analog digital converters distributed in N channels, each analog digital converter having a sampling frequency N times lower than the required sampling frequency ($F_e$), said analog digital converters having clock signals controlling their sampling frequency, offset in time from each other by one period (Δ) of a signal at the required sampling frequency ($F_e$), the digital signal being built up from samples delivered to the output from each channel, said analog digital conversion device comprising a reference channel, said reference channel comprising an analog digital converter generating samples of the analog signal, each channel comprising an equalizer filter, and a summer connected to an output of said equalizer filter and connected to an output of the analog digital converter of the reference channel, said filter receiving a digital signal at its input output by the analog digital converter on the channel on which it is located and an error signal output by said summer, said filter outputting a filtered digital signal s(n) corrected for errors deduced from the error signal, the error signal corresponding to the difference at a given time between firstly the digital signal corrected by the filter and secondly by the digital signal output by the analog digital converter of the reference channel, the coefficients of said filter being adjusted to present the response that best minimizes the error signal.

* * * * *